United States Patent
Vankayala

(10) Patent No.: US 11,762,786 B2
(45) Date of Patent: Sep. 19, 2023

(54) LOW POWER AREA EFFICIENT DIVIDED CLOCK SHIFTER SCHEME FOR HIGH LATENCY DESIGNS

(71) Applicant: Micron Technology, Inc., Boise, ID (US)

(72) Inventor: Vijayakrishna J. Vankayala, Allen, TX (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 17/410,623

(22) Filed: Aug. 24, 2021

(65) Prior Publication Data

US 2023/0068313 A1 Mar. 2, 2023

(51) Int. Cl.
*G06F 13/16* (2006.01)
*G06F 1/06* (2006.01)
*G11C 19/00* (2006.01)

(52) U.S. Cl.
CPC .......... *G06F 13/1668* (2013.01); *G06F 1/06* (2013.01); *G11C 19/00* (2013.01)

(58) Field of Classification Search
CPC .............................. G06F 13/1668; G06F 1/06
See application file for complete search history.

(56) References Cited

U.S. PATENT DOCUMENTS

| 2008/0028127 | A1* | 1/2008 | Ware | G06F 3/061 |
| | | | | 711/100 |
| 2020/0373929 | A1* | 11/2020 | Jang | H03L 7/10 |

\* cited by examiner

*Primary Examiner* — David E Martinez
(74) *Attorney, Agent, or Firm* — Fletcher Yoder, P.C.

(57) ABSTRACT

A memory device including memory cells operating according to a first clock signal having a first clock frequency and accessed based on a data access time. The memory device may include a clock shifter circuit for delaying the access commands based on the data access time. The clock shifter circuitry include a shift register circuit and a phase correction circuit. The shift register circuit delays the access commands using a second clock signal having a fraction of the first clock frequency. The phase correction circuit receives the access commands from the shift register circuitry using the fraction of the first clock frequency, delays the access commands based on phase information of the access commands, and outputs the access commands to the memory cells based on the data access time using the first clock frequency.

7 Claims, 7 Drawing Sheets

LOW POWER AREA EFFICIENT DIVIDED CLOCK SHIFTER SCHEME FOR HIGH LATENCY DESIGNS

BACKGROUND

1. Field of the Present Disclosure

This disclosure relates to memory devices, and more particularly, to methods and systems for low power and area efficient memory clock shifter circuits for memory devices.

2. Description of Related Art

Different memory types, such as random access memory (RAM) devices, dynamic RAM devices (DRAMs), static RAM devices (SRAMs), threshold-type memory devices, or flash memories, are often used in electronic systems to provide memory functionality to facilitate data processing operation and/or facilitate data storage that may facilitate data processing operations. To that end, these memory devices may include multiple memory cells that can each store one or more bits of information. The memory cells may be arranged in addressable groups (e.g., rows or columns) within a memory array of a memory bank.

Memory devices may also include various circuitry such as a clock circuit, a memory controller circuit, and a clock shifter circuit. A memory device may operate based on using a clock signal provided by a clock circuit of the memory device. For example, a memory controller may receive read commands, access memory cells, and transmit command signals and/or data based on a clock frequency rate of the clock signal provided by the clock circuit. Different memory devices may include different clock circuits each providing one or more clock signals, each with different clock frequency rates. In some cases, new generations of a memory device may use clock circuits with faster clock frequency rates. That said, memory devices may access memory cells based on a cell access time associated with the memory device using the clock signal.

The cell access time may indicate a latency between transmission of command signals (e.g., request for data, memory cell activation signals) to the memory cells and return of the requested data from the memory cells. In some cases, the cell access time may be associated with a permutation of the memory cells, rows, and/or columns of the memory device. That is, the cell access time of a memory device may not be directly dependent on a clock frequency rate of the memory device. For example, in specific cases, new generations of a memory device may use clock circuits with faster clock frequency rates with the same, or not proportionally improved, cell access time. As such, when accessing the memory cells, the clock shifter circuit may delay the command signals to allow return of data associated with previous data requests based on the cell access time.

The clock shifter circuit may include circuitry (e.g., buffer circuitry) to sufficiently delay the command signals by a number of clock cycles based on the cell access time and the clock frequency rate. However, as the clock frequency rate of memory devices becomes faster, the clock shifter circuit may delay larger numbers of data bits based on using the same (or not proportionally improved) cell access time. As such, improved clock shifter circuits are desired to sufficiently delay the command signals by the way of efficient use of area and power on a memory device.

BRIEF DESCRIPTION OF THE DRAWINGS

Various aspects of this disclosure may be better understood upon reading the following detailed description and upon reference to the drawings in which.

DETAILED DESCRIPTION

Figure 1:
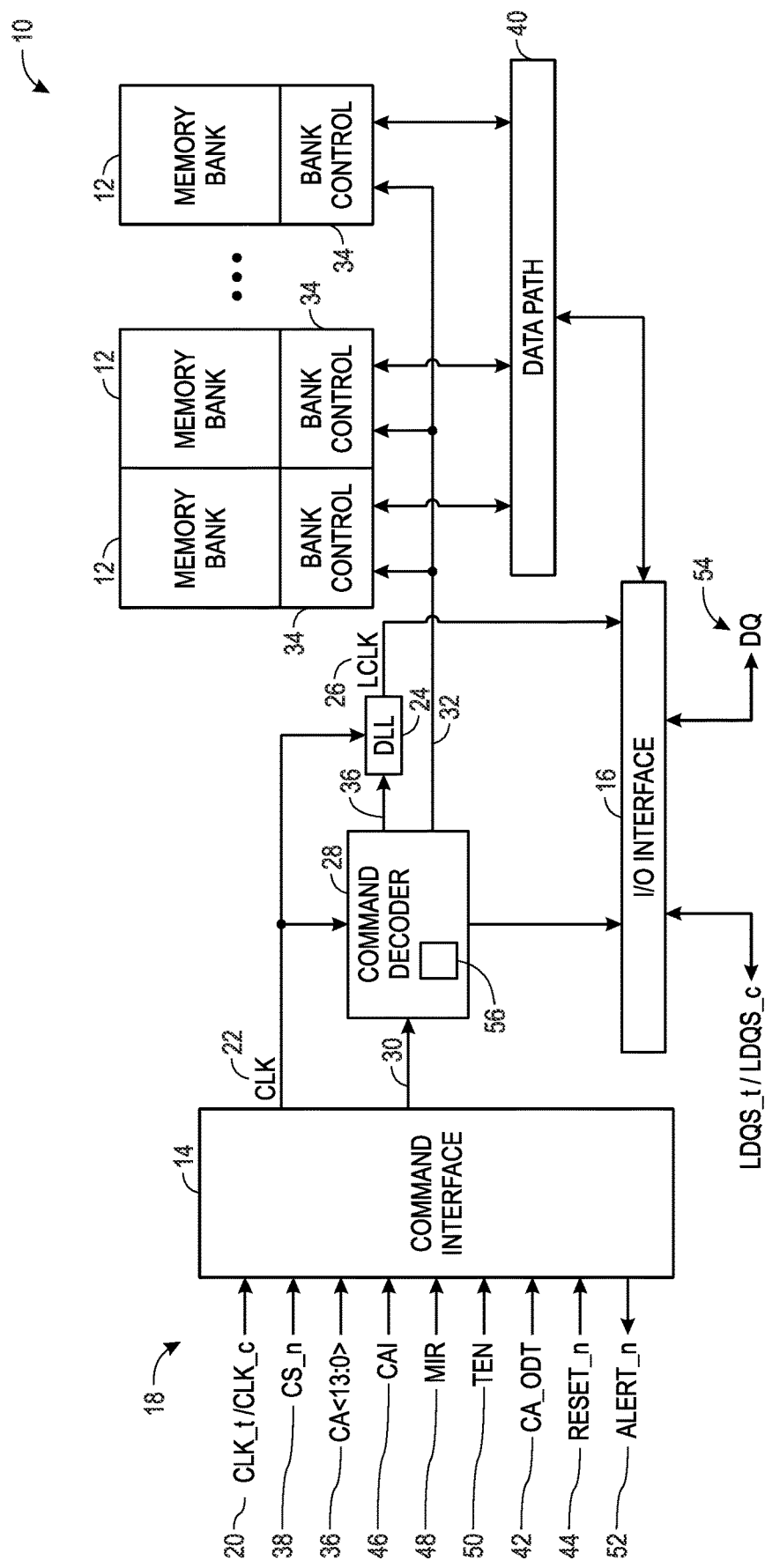
FIG. 1 is a block diagram illustrating a memory device, in accordance with an embodiment.

One or more specific embodiments will be described below. In an effort to provide a concise description of these embodiments, not all features of an actual implementation are described in the specification. It may be appreciated that in the development of any such actual implementation, as in any engineering or design project, numerous implementation-specific decisions must be made to achieve the developers' specific goals, such as compliance with system-related and business-related constraints, which may vary from one implementation to another. Moreover, it may be appreciated that such a development effort might be complex and time consuming, but would nevertheless be a routine undertaking of design, fabrication, and manufacture for those of ordinary skill having the benefit of this disclosure.

Many electronic systems may employ memory devices to provide data storage functionalities and/or facilitate the performance of data processing operations. A memory device may store data using electronic memory cells, such as capacitors, flip-flops, latches, and/or inverter loops, among others, grouped in memory arrays. Examples of memory devices may include random access memories (RAMs) devices, dynamic RAM (DRAMs) devices, static RAM (SRAMs) devices, threshold memory devices (e.g., phase-change (PC) memory devices or self-selecting memory (SSMs) devices), and/or flash memories.

The memory device may include various components operating based on a clock signal provided by a clock circuit of the memory device. The memory device may perform memory operations, such as read operations and write operations, based on clocking read and write commands (e.g., access commands) using the clock signal. For example, a memory controller of the memory device may communicate the read and write commands at a clock frequency rate of the clock signal.

Different variations of a memory device may include different memory clock circuits each providing one or more clock signals, each with a different clock frequency. In some cases, different generations of a memory device, such as a Dual Data Rate (DDR) memory device or a memory device using PC or a SSM memory cell technology, may include different memory clock circuits. As such, different variations of a memory device may operate based on a clock signal having a different clock frequency. For example, a later version of a memory device may include a memory clock circuit that provides a clock signal with higher clock frequency than an earlier version of the same memory device.

That said, the memory cells of a memory device may be accessed (e.g., read) based on a data access time of the memory device. The data access time may correspond to a delay between providing a request for stored data and returning the requested data from the memory cells. In some cases, the data access time of a memory device may be imposed based on an architecture, permutation, and/or material used to form memory arrays of the memory device. That is, the data access time may be, at least partially, independent from the clock signal and the frequency rate at which the clock signal toggles.

For example, PC or SSM memory devices using cross-point memory architectures may have a different data access time than DDR memory devices using DDR memory architectures. That said, in some cases, different variations (e.g., generations) of a memory device may have similar data access times based on using similar architectures (e.g., cross-point memory architecture, DDR memory architecture, etc.), permutation, and/or material, among other things. Accordingly, different variations (or versions) of a memory device may have similar data access times and different clock frequency rates.

In one example, a DDR4 memory device may use a clock signal with 1600 Megahertz (MHz) clock frequency and a DDR5 memory device may use a clock signal with 3200 MHz clock frequency. However, the DDR4 and the DDR5 memory devices may have relatively similar data access times. As such, in some cases, different variations of a memory device may access the respective memory cells using the same data access time and different number of clock cycles based on operating according to different clock frequency rates.

In one embodiment, a first variation of a memory device may have a data access time of 15 nano-Second (nS) and use a memory clock circuit providing a clock signal with a clock frequency of 1 Giga-Hertz (GHz). Based on the clock frequency, the memory device may provide each data bit of a read command using one clock cycle with a wavelength of 1 nS. Accordingly, the memory device may delay returning the requested data stored on the memory cells by 15 clock cycles based on the clock frequency and the data access time.

In a different embodiment, a second variation of the memory device may have a data access time of 15 nS and use a memory clock circuit toggling the clock signal at a faster clock frequency rate of 2 GHz. For example, the second variation of the memory device may be a later generation compared to the first variation. In any case, based on the clock frequency, the memory device may provide each data bit of a read command using one clock cycle with a wavelength of ½ nS. Accordingly, the memory device may delay returning the requested data by 30 clock cycles based on the clock frequency and the data access time. As such, using a higher clock frequency with the same data access time may result in a higher number of delay clock cycles.

With the foregoing in mind, a memory device may include a clock shifter circuit for sufficiently delaying the access commands, provided at a rate of the clock frequency, based on the data access time. For example, the clock shifter circuit may delay the read commands for a number of clock cycles based on the data access time and the clock frequency. As such, using a higher clock frequency with the same data access time may result in using a shift register circuit capable of providing a higher number of delay clock cycles.

A clock shifter circuit may delay access commands using latching circuitry such as shift registers. The shift registers may include capacitors, flip-flops, inverter loops, among other things. In some embodiments, a memory device may include a clock shifter circuit with a set number of shift registers (e.g., flip-flops) positioned in series. In such embodiments, the clock shifter circuit may delay each data bit of a read command based on passing the data bits through the set number of shift registers. That is, each shift register of the set number of shift registers may delay each data bit by one clock cycle. Accordingly, the number of shift registers positioned in series may correspond to the number of delay clock cycles. For example, 30 shift registers positioned in series may provide for delaying each data bit by 30 clock cycles.

In some embodiments, a clock shifter circuit may also use phase information of the data bits (e.g., access commands) to provide a higher number of delay clock cycles. Such clock shifter circuits may be scalable to provide a higher number of clock cycles for delaying each data bit while using less space in the memory device and consuming lower power compared to conventional circuits. The clock shifter circuit may compare each data bit of the access commands with phase information of the respective data bit to allow the shift registers to use a scaled down clock signal having a divided clock frequency.

Accordingly, such clock shifter circuits may delay each data bit based on using a scaled down clock signal having a divided clock frequency with the shift registers. For example, using a scaled down clock signal with half of clock frequency of a memory clock circuit with 31 shift registers may result in delaying each data bit by 62 clock cycles of the memory clock circuit. The clock shifter circuits described herein may use a scaled down clock signal and phase information of the access commands to provide sufficient delay, while maintaining low power consumption and occupying a fixed (and in some cases reduced) footprint, as will be appreciated.

Turning now to the figures, FIG. 1 is a simplified block diagram illustrating certain features of a memory device 10. In different embodiments, the memory device 10 may be a DDR memory device (e.g., DDR3, DDR4, DDR5, etc.), a cross-point memory device, or any other suitable memory type. Nevertheless, the memory device 10 may include a number of memory banks 12. For example, the memory banks 12 may include DDR memory banks (e.g., DDR5 SDRAM memory banks) or cross-point memory banks, such as PC or SSM memory banks. Moreover, in some embodiments, the memory banks 12 may be provided on one or more chips (e.g., SDRAM chips) that are arranged on dual inline memory modules (DIMMs). For example, each DIMM may include a number of memory chips (e.g., ×8 or ×16 memory chips).

Each memory chip may include one or more memory banks 12. The memory device 10 may represent a portion of a single memory chip having a number of memory banks 12. In different embodiments, different configurations, organization, and sizes of the memory banks 12 on the memory device 10 may be utilized depending on the application and design of the overall system.

The memory device 10 may include a command interface 14 and an input/output (I/O) interface 16. The command interface 14 is configured to receive a number of signals (e.g., signals 18) from processing circuitry coupled to the devices, such as a processor or controller. The processor or controller may provide various signals 18 to the memory device 10 to facilitate the transmission and receipt of data to be written to or read from the memory device 10. As an example of the signals 18, the processor or controller may request a read and/or write operation by providing the corresponding read and/or write commands and an address via a CA bus.

The command interface 14 may receive one or more clock signals from a memory clock circuit. Generally, the memory device 10 may utilize an external clock signal 20, which may be provided as a single or differential pair, formed by the true clock signal (Clk_t) and the complementary clock signal (Clk_c). For example, the positive clock edge for the external clock signal 20 refers to the point where the rising true clock signal Clk_t crosses the falling complementary clock signal Clk_c, while the negative clock edge indicates that transition of the falling true clock signal Clk_t and the rising of the complementary clock signal Clk_c. Commands (e.g., read command, write command, etc.) are typically entered on the positive edges of the clock signal and data is transmitted or received on both the positive and negative clock edges, as will be appreciated.

The command interface 14 receives the external clock signal 20 and generates an internal clock signal CLK signal 22. In some embodiments, the CLK signal 22 may have a frequency that is a fraction of a frequency of the external clock signal 20 (e.g., divided by 2, divided by 4, or any other viable fraction. The CLK signal 22 may be supplied to an internal clock generator, such as a delay locked loop (DLL) circuit 24. The DLL circuit 24 generates a phase controlled internal clock signal LCLK 26 based on the received CLK signal 22.

The phase controlled internal clock signal LCLK 26 is supplied to the I/O interface 16, for instance, and is used as a timing signal for determining an output timing of read data. The CLK signal 22 may also be provided to various other components within the memory device 10 and may be used to generate various additional internal clock signals. For instance, the CLK signal 22 may be provided to a command decoder 28. The command decoder 28 may receive command signals from the command bus 30 and may decode the command signals to provide various internal commands. In specific embodiments, the command decoder 28 may receive the CLK signal 22 and provide an output clock signal with a fraction of the CLK signal 22 clock frequency (e.g., divided by 2, divided by 4, or any other viable fraction).

Further, the command decoder 28 may decode commands, such as read commands, write commands, mode-register set commands, activate commands, etc., and provide access to one or more particular memory banks 12 corresponding to the command, via a bus 32. As will be appreciated, the memory device 10 may include various other decoders, such as row decoders and column decoders, to facilitate access to the memory banks 12. In one embodiment, each memory bank 12 includes a bank control circuitry 34 which provides the necessary decoding (e.g., row decoder and column decoder), as well as other features, such as timing control and data control, to facilitate the execution of commands to and from the memory banks 12.

The memory device 10 executes operations, such as read commands and write commands, based on command/address signals 36 received from an external device, such as a processor. In one embodiment, the command/address (CA) bus may be a 14-bit bus to accommodate the command/address signals (CA<13:0>) 36. The command/address signals 36 are clocked to the command interface 14 using the external clock signal 20, as discussed above. Access to specific memory banks 12 within the memory device 10 is encoded on the CA<13:0> bus with the commands.

As an example, a processor requesting data from memory device 10 may provide a CS enable signal 38 via an input pin to inform the memory device 10 that it may operate on the CA signal 36 available in the bus. To this end, the command interface 14 and/or the command decoder 32 may receive the CA signal 36 to identify the command and the target memory banks 12 associated with the address in the CA signal 36. The command decoder 28 may, via the bus 32, request the bank control circuitry 34 associated with the target memory bank 12 to activate a data row or data column associated with the requested address in the CA signal 36. Based on the command received via the bus 28, the bank control circuitry 34 may cause the memory banks 12 to provide the requested data via data path 40 and I/O interface 16 or to store in the memory banks 12 data available in the data path 40, received via I/O interface 16.

In addition, the command interface 14 may be configured to receive a number of other command signals. For instance, a command/address on die termination (CA_ODT) signal 42 may be provided to facilitate proper impedance matching within the memory device 10. A reset command (RESET) signal 44 may be used to reset the command interface 14, status registers, state machines, and the like, during power-up for instance. The command interface 14 may also receive a command/address invert (CAI) signal 46 which may be provided to invert the state of command/address signals CA<13:0> 36 on the command/address bus, for instance, depending on the command/address routing for the particular memory device 10.

A mirror (MIR) signal 48 may also be provided to facilitate a mirror function. The MIR signal 48 may be used to multiplex signals so that they can be swapped for enabling certain routing of signals to the memory device 10, based on the configuration of multiple memory devices in a particular application. Various signals to facilitate testing of the memory device 10, such as the test enable (TEN) signal 50, may be provided, as well. For instance, the TEN signal may be used to place the memory device 10 into a test mode for connectivity testing.

The command interface 14 may also be used to provide an alert signal (ALERT) 52 to the system processor or controller for certain errors that may be detected. For instance, an alert signal (ALERT) 52 may be transmitted from the memory device 10 if a cyclic redundancy check (CRC) error is detected. Other alert signals 52 may also be generated. Further, the bus and pin for transmitting the alert signal (ALERT) 52 from the memory device 10 may be used as an input pin during certain operations, such as the connectivity test mode executed using the TEN signal 50, as described above.

Data may be sent to and from the memory device 10, utilizing the command/address signals 36 and the external clock signal 20 discussed above, by transmitting and receiving data signals (DQ signals) 54 through the I/O interface 16. More specifically, the data may be sent to or retrieved from the memory banks 12 over the data path 40, which includes a plurality of bi-directional data buses. Data IO signals, generally referred to as DQ signals 54, are generally transmitted and received in one or more bi-directional data busses.

Various other components such as power supply circuits (for receiving external VDD and VSS signals), mode registers (to define various modes of programmable operations and configurations), read/write amplifiers (to amplify signals during read/write operations), temperature sensors (for sensing temperatures of the memory device 10), etc., may also be incorporated into the memory device 10. Accordingly, it should be understood that the block diagram of FIG. 1 is only provided to highlight certain functional features of the memory device 10 to aid in the subsequent detailed description.

Moreover, the memory 10 may include a clock shifter circuit 56. Although in the depicted embodiment the command decoder 28 includes the clock shifter circuit 56, it should be appreciated that different blocks of the memory 10 may include the clock shifter circuit 56. For example, the command interface 14, the command decoder 28, the I/O interface 16, any other component, or any combination of components may include the clock shifter circuit 56.

Figure 2:
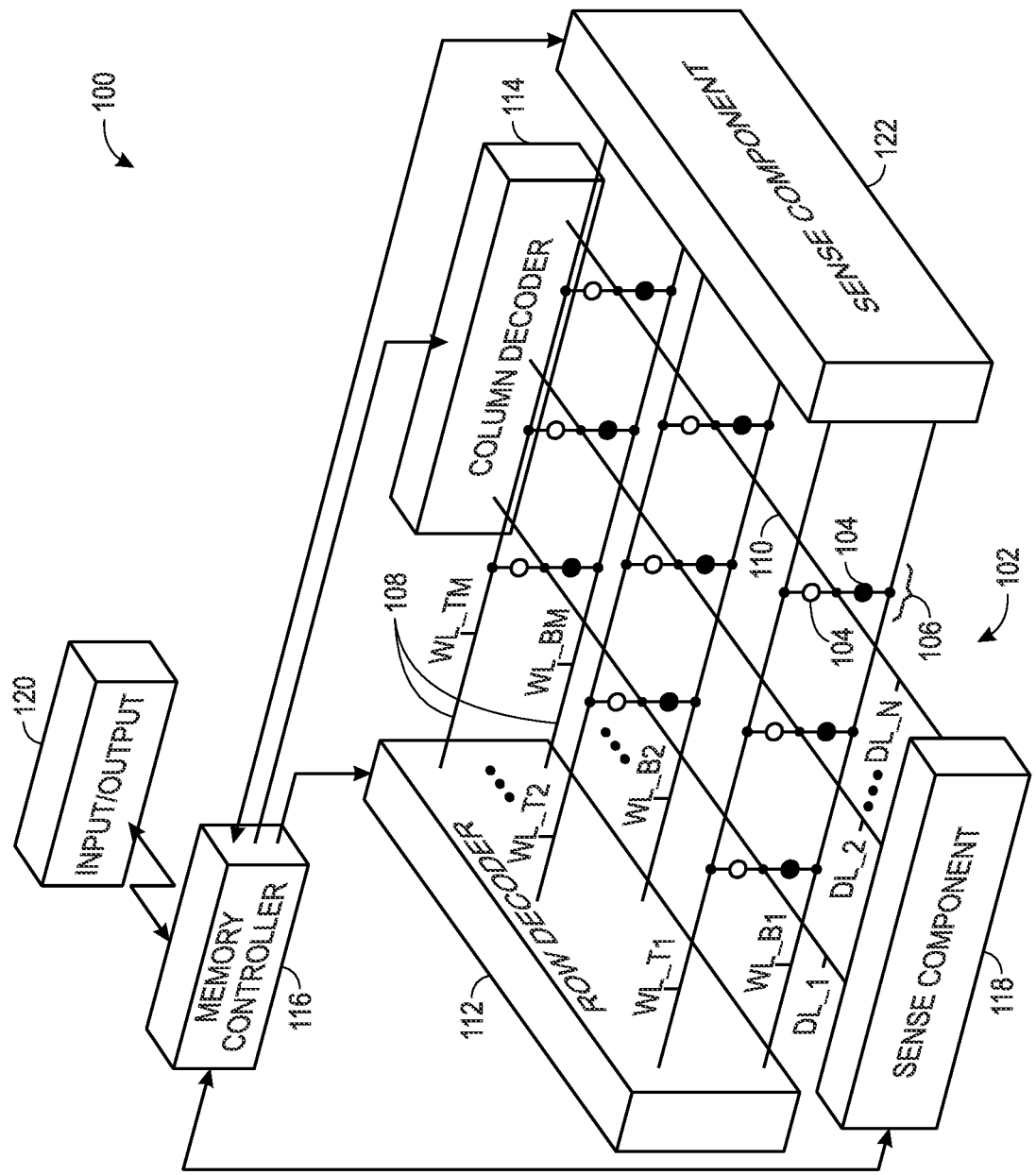
FIG. 2 is a block diagram illustrating a memory device including a 3D memory array, in accordance with an embodiment.

FIG. 2 illustrates an example memory device 100 in accordance with some embodiments of the present disclosure. In some cases, the memory device 100 may be similar to the memory device 10 described above. The memory device 100 may include a 3D memory array 102. In some embodiments, the 3D memory array 102 may include a phase change (PC) memory and/or other chalcogenide-based memory, such as self-selecting memories (SSM). That said, the memory device 100 may illustrate functional inter-relationships and may not represent the actual physical positions of components within the memory device 100.

The 3D memory array 102 may include memory cells 104 that may be programmable to store different states. In some embodiments, each memory cell 104 may be programmable to store two states, denoted as a logic 0 and a logic 1. However, in some embodiments, each memory cell 104 may store more than two logic states. In some embodiments, the memory cells 104 may include a Phase Change Cell (PC cell), such as a 3D XPoint (cross-point) memory cell, or a chalcogenide-based memory cell, such as a SSM memory cell.

Accordingly, in such embodiments, the memory cells 104 may include threshold-type memory cells and may be accessed by providing respective read or write threshold voltage (VTH) to the respective access lines of each targeted memory cell. Furthermore, although some elements included in FIG. 2 are labeled with a numeric indicator, other corresponding elements may not be labeled, in an effort to increase visibility and clarity of the depicted features.

The 3D memory array 102 may include two or more 2D memory arrays formed adjacent to one another (e.g., on top of or next to one another). In some embodiments, such arrangement of the 3D memory array 102 may increase a number of memory cells 104 on a respective die or substrate as compared with 2D arrays. As such, using the 3D memory array 102 may reduce production costs, increase the performance of the memory device, or both.

The depicted 3D memory array 102 may include two levels (or "decks") of memory cells 104. However, it should be appreciated that in different embodiments, the 3D memory array 102 may include different number of memory cell levels. That is, the 3D memory array 102 may not be limited to two levels of memory cells 104 and may include a different number of levels. Each level of memory cells 104 may be aligned or positioned such that the respective memory cells 104 may be aligned (exactly, overlapping, or approximately) with one another across each level to form a memory cell stack 106. In some cases, the memory cell stack 106 may include two PC cells (e.g., two 3D XPoint memory cells), two SSM cells, or a combination of both, with one disposed above the other.

In the depicted embodiment, each row of the memory cells 104 may be connected to a word line 108, and each column of memory cells 104 may be connected to a bit line 110. Moreover, the word lines 108 and the bit lines 110 may be substantially perpendicular to one another to create an array of memory cells. Furthermore, the two adjacent memory cells 104 in the memory cell stack 106 may share a common bit line 110. That is, the bit line 110 may be in electronic communication with the bottom electrode of the upper memory cell 104 and the top electrode of the lower memory cell 104 of each memory cell stack 106.

In other embodiments, each of the memory cells 104 (e.g., the upper memory cell 104 and the lower memory cell 104) may include a dedicated bit line 110. In such embodiments, the memory cells 104 may be separated by an insulation layer. Other configurations of the memory cells 104 in the 3D memory array 102 may include a third layer sharing a word line 108 with a lower layer. Nevertheless, each memory cell 104 may be positioned at an intersection of two conductive lines, such as one word line 108 and one bit line 110. Such intersection may correspond to an address of the respective memory cell 104.

A target memory cell 104 may be accessed by applying an appropriate current or an appropriate voltage at the intersection of the respective word line 108 and the respective bit line 110. That is, the respective word line 108 and the respective bit line 110 may be energized, with a respective read VTH or write VTH, in order to read from or write to the memory cells 104.

Electrodes may be coupled to the memory cells 104 between the respective word lines 108 and bit lines 110. The term electrode may refer to an electrical conductor, and in some cases, may be employed as an electrical contact to the memory cell 104. An electrode may include a trace, wire, conductive line, conductive layer, or the like that provides a conductive path between elements or components of the memory device 100. In some embodiments, the memory cells 104 may include a chalcogenide alloy positioned between a first electrode and a second electrode. The chalcogenide alloy may store a logic value (e.g., as the logic storing device) written to respective memory cells 104.

One side of the first electrode may be coupled to the word line 108 and the other side of the first electrode may be coupled to the chalcogenide alloy. In addition, one side of the second electrode may be coupled to the bit line 110 and the other side of the second electrode may be coupled to the chalcogenide alloy. The first electrode and the second electrode may include the same material (e.g., carbon) or different materials.

In specific embodiments, the memory cell 104 may include an additional electrode to separate the chalcogenide alloy into two parts. A first part of the chalcogenide alloy may have a different composition than a second part of the chalcogenide alloy. In some embodiments, the first part of the chalcogenide alloy may have a different function than the second part of the chalcogenide alloy. The additional electrode may be the same material (e.g., carbon) or different than the first electrode and/or the second electrode.

That said, memory read and write operations may be performed on memory cells 104 by providing selection signals to the respective word lines 108 and bit lines 110. In some embodiments, the selection signals are interchangeable between the word lines 108 and the bit lines 110 of the 3D memory array 102. Moreover, as discussed above, the selection signals may include a respective voltage selected according to a respective VTH for reading from or writing to the memory cells 104. For example, the selection signals may include a first voltage for writing a value on the memory cells 104 while the selection signals may include a different voltage for reading a value stored on the memory cells 104.

In different embodiments, the word lines 108 and the bit lines 110 may include conductive materials such as metals (e.g., copper (Cu), aluminum (Al), gold (Au), tungsten (W), titanium (Ti)), metal alloys, carbon, conductively-doped semiconductors, or other conductive materials, alloys, compounds, or the like. Moreover, in some embodiments, the logic storing device of the memory cells 104 may be electrically isolated from the respective bit lines 110 by a selection component. In such embodiments, the respective word lines 108 may be connected to the selection component. For example, the selection component may be a transistor and the word line 108 may be connected to the gate of the transistor.

Energizing the word lines 108 may result in an electrical connection (e.g., closed circuit connection) between the logic storing device of the respective memory cells 104 and the corresponding bit lines 110. The bit lines 110 may also be energized to access (e.g., read or write) the respective memory cells 104. When reading the memory cells 104, the resulting signal upon accessing the memory cells 104 may indicate the stored logic state of the respective memory cells 104.

In some embodiments, a first logic state may correspond to no current or a small current, whereas a second logic state may correspond to an amount of current higher than a threshold. In different embodiments, the memory cells 104 may include a 3D XPoint memory cell, a self-selecting memory (SSM) cell, or a chalcogenide-based memory having two terminals. As such, the terminals of each 3D XPoint memory cell, the SSM cell, or the chalcogenide-based may be electrically connected to a respective word line 108 and a respective bit line 110.

A row decoder 112 and a column decoder 114 may control accessing the memory cells 104. For example, a memory controller 116 may send row address signals to the row decoder 112 to energize the appropriate word lines 108. The memory controller 116 may also send column address signals to energize the appropriate bit lines 110. For example, the 3D memory array 102 may include multiple word lines 108, labeled WL_B1 (or WL_T1) through WL_BM (or WL_TM), and multiple bit lines 110, labeled DL_1 through DL_N, where M and N depend on the array size. Thus, by energizing the appropriate word lines 108 and bit lines 110 (e.g., WL_B2 and DL_3) the respective memory cells 104 at their intersection may be accessed.

Upon accessing the memory cells 104, a sense component 118 may read (or sense) the stored logic state. For example, a voltage may be applied to the respective memory cells 104, by energizing the corresponding word line 108 and bit line 110, and a resulting current amount may determine the stored logic state of the respective memory cell 104. In one embodiment, the sense component 118 may determine a resulting voltage based on the resulting current when the memory cells 104 are accessed. The resulting voltage may indicate the stored logic state of the memory cell 104.

In some embodiments, different voltage levels may be applied to the respective memory cells 104. For example, if an applied voltage does not result in a current flow, other voltages may be applied until a current is detected by the sense component 118. Alternatively, the voltage may be ramped up in magnitude until a current flow is detected (e.g., the respective memory cell 104 turns on, switches on, conducts current, or becomes activated). In other cases, predetermined voltages may be applied sequentially until a current is detected. Similarly, a current may be applied to the memory cells 104 and the magnitude of the voltage to create the current may depend on the electrical resistance or the threshold voltage of the memory cells 104. Nevertheless, it should be appreciated that such voltage and/or current may be provided according to respective read and write VTH when performing the read and write operations.

In some embodiments, the sense component 118 may be part of the column decoder 114. In other embodiments, the sense component 118 may be positioned at a different location and be electrically connected to the column decoder 114. The sense component 118 may include various transistors or amplifiers in order to detect, amplify, and/or maintain the resulting current, which may be referred to as latching.

The detected logic state of the memory cells 104 may then be output through the column decoder 114 via the input/output 120. FIG. 2 also illustrates a sense component 122. As illustrated, the sense component 122 may be coupled to the word lines 108 and may operate in conjunction with the row decoder 112. For example, similar to the operations of the sense component 118 described above, the sense component 122 may operate in conjunction with the row decoder 112.

Additionally, as will be described in greater detail below, the sense component 122 may also include circuitry to perform additional operations that are not performed via the sense component 118. For example, in specific embodiments, the sense component 118 may perform snap detection of a target memory cell 104 of the 3D memory array 102. In some embodiments, the column decoder 114 may include the sense component 122. Alternatively, the sense component 122 may be connected to or may be in electronic communication with the column decoder 114.

Moreover, the memory cells 104 may be set or written to by energizing the respective word lines 108 and bit lines 110 using write commands. In different embodiments, one or more logic values may be stored in the memory cell 104. The column decoder 114 and/or the row decoder 112 may receive the write instructions, indicative of memory cell address and data, to be written to one or more of the memory cells 104 from the memory controller 116 and via the input/output 120. In some memory architectures, accessing the memory cells 104 may degrade or destroy the stored logic state. Accordingly, the memory device 100 may perform re-writing and/or refreshing operations after a read operation to return the original logic state to the memory cells 104.

In DRAM, for example, the capacitor of a memory cell 104 may be partially or completely discharged during a sense operation, corrupting the stored logic state. So, the logic state may be re-written after a sense operation. Additionally, in some embodiments, energizing a single word line 108 may result in the discharge of all memory cells 104 in the row. Thus, several or all memory cells 104 in the row may need to be re-written. However, in other non-volatile memory, such as SSM, PC memory (e.g., 3D XPoint memory), SSM memory, FeRAM, or 3D NAND memory, accessing the memory cells 104 may not destroy the logic state and, thus, the memory cells 104 may not require re-writing after accessing.

In operation, the memory controller 116 may control the memory operations (e.g., read, write, re-write, refresh, discharge) of the memory cells 104 through the various components. For example, the memory controller 116 may control operations of the row decoder 112, column decoder 114, sense component 118, sense component 122, and other components that may not be shown in the depicted embodiment. In some cases, one or more of the row decoder 112, column decoder 114, sense component 118, and sense component 122 may be co-located with the memory controller 116. Based on receiving the read/write commands, the memory controller 116 may generate row and column address signals in order to energize the desired word lines 108 and bit lines 110. Moreover, the memory controller 116 may also generate and control various voltages or currents used during the operation of the memory device 100.

In some embodiments, the memory controller 116 may generate and transmit the commands to the command interface 14 of FIG. 1. In alternative or additional embodiments, the memory controller 116 may include the command interface 14 of FIG. 1. Moreover, in specific embodiments, the input/output 120 may include the I/O interface 16, the command interface 14, both, or any other memory components described with respect to FIG. 1.

In any case, the memory controller 116 may receive user data (e.g., input data) through the input/output 120, which may be a physical connection or a path coupled to a connector of the memory device 100. In some embodiments, when performing memory read operation, the memory controller 116 may read a previous user data from the memory cells 104, write a new user data, and merge the new user data with the previous user data into memory registers (e.g., shift registers) of the clock shifter circuit 56 (described above with respect to FIG. 1). Thereafter, mask register (MR) information may be generated, wherein the mask register information may indicate bits of the previous user data stored in the memory cells 104 to be switched or not to be switched in their logic values.

In some embodiments, the memory controller 116 may count numbers of a first logic value (logic "0") and a second logic value (logic "1") to be written using the MR information, respectively. The memory controller 116 may also store the number of the first logic values and the second logic values into a first counter and a second counter, respectively. In some embodiments, the memory controller 116 may apply a programming pulse to the memory cells 104 according to the mask register information.

In some embodiments, the memory controller 116 may adaptively adjust operations of the memory device 100 to reduce erroneous memory operations. In general, the memory controller 116 may adjust the amplitude, shape, polarity, and/or duration of an applied voltage or current discussed herein for various operations of the memory device 100. For example, during an access operation, such as a reset operation, a write operation and/or a read operation, the memory controller 116 may adaptively control the access current and/or a voltage based at least in part on the respective read/write VTH.

Moreover, the memory 100 may include the clock shifter circuit 56. The memory controller 116, the input/output 120, the row decoder 112, the column decoder 114, the sense component 118, the sense component 122, or any combination of the components may include the clock shifter circuit 56, as previously described.

Figure 3:
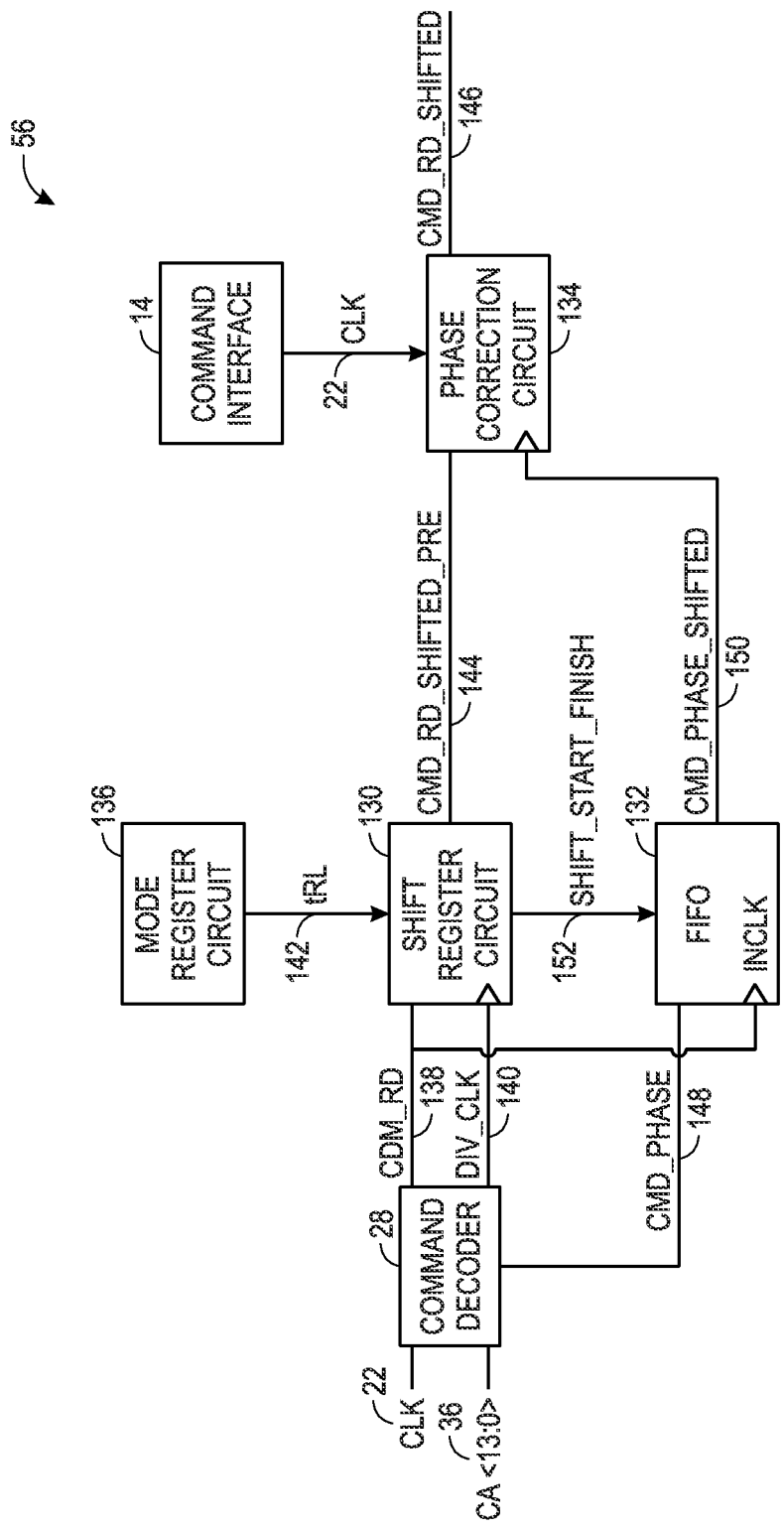
FIG. 3 is a block diagram illustrating a clock shifter circuit that may be used by memory devices of FIG. 1 and FIG. 2, in accordance with an embodiment.

Referring now to FIG. 3, the clock shifter circuit 56 is depicted with respect to some embodiments of the present disclosure. The clock shifter circuit 56 may use phase information of a command as well as a clock signal different from the memory device 10 or 100 reference clock signal. The clock signal may have a divided clock frequency to delay the command based on the data access time, as will be appreciated. As mentioned above, the memory device 10 or the memory device 100 may include the clock shifter circuit 56.

In some embodiments, the memory controller 116, the column decoder 114, the row decoder 112, the sense component 118, the sense component 122, or a combination of such components depicted in FIG. 2 may include the clock shifter circuit 56. In some other embodiments, the command decoder 28, the command interface 14, the I/O interface 16, the data path 40, or a combination of such components depicted in FIG. 1 may include the clock shifter circuit 56. In any case, the clock shifter circuit 56 may delay read commands for a number of clock cycles based on the data access time of the memory devices 10 and/or 100 using low power and small footprint.

The clock shifter circuit 56 may include a shift register circuit 130, a first in first out (FIFO) circuit 132, a phase correction circuit 134, and a mode register circuit 136. In some embodiments, the clock shifter circuit 56 may be scalable using the shift register circuit 130, the FIFO 132, and the phase correction circuit 134. For example, in different embodiments, the clock shifter circuit 56 may delay the read commands for different numbers of clock cycles using the shift register circuit 130, the FIFO 132, and the phase correction circuit 134, as will be appreciated.

The clock shifter circuit 56 may use single bit or multiple bit phase information based on using a clock signal with different clock frequency divisions. Accordingly, the clock shifter circuit 56 may be configurable to delay the read commands for different numbers of clock cycles based on using different clock signals having different clock frequencies with the memory devices 10 or 100 having similar data access time, as mentioned above and discussed in detail below.

In some examples, using a constant data access time, the clock shifter circuit 56 may be modified to delay the read commands by a higher number of clock cycles based on using a clock signal with a lower clock frequency (e.g., clock frequency divided by 2, 4, 8, etc.). The shift register circuit 130 may include circuitry, such as a number of flip-flops positioned in series, to delay (or shift) data bits of a read command signal using such lower clock signal with lower clock frequency. Accordingly, to delay (or shift) data bits of a read command signal, the shift register circuit 130 may receive a command read (cmd_rd) signal 138 with a clock signal having divided clock frequency (div_clk) signal 140.

In some embodiments, the shift register circuit 130 may use rising/falling edges of the div_clk signal 140 to latch (input) the cmd_rd signal 138, shift through (or delay), and output a cmd_rd_shifted_pre signal 144. Accordingly, the shift register circuit 130 may operate based on a clock frequency of the div_clk signal 140. As mentioned above, the div_clk signal 140 may have a clock frequency that is a fraction of the external clock signal 20 or the internal clock signal (CLK) signal 22. Although embodiments herein are described with respect to the CLK signal 22 as a reference clock signal, it should be appreciated that similar or different embodiments may use the external clock signal 20 as the reference signal.

In any case, the command decoder 28 may include circuitry to receive the CLK signal 22 (or the external clock signal 20 in different embodiments) and generate the div_clk signal 140. In alternative or additional embodiments, the DLL circuit 24 may receive the CLK signal 22, generate and provide the div_clk signal 140 to the shift register circuit 130. In yet alternative or additional embodiments, the CLK signal 22 may include the div_clk signal 140. Nevertheless, the div_clk signal 140 may have a clock frequency that is half (½), a quarter (¼$^{th}$), an eight (⅛$^{th}$), or some other fraction of the CLK signal 22 (or the external clock signal 20).

The shift register circuit 130 may also receive a tRL signal 142 from the mode register circuit 136. The tRL signal 142 may provide a data latency value by providing a number of delay clock cycles to the shift register circuit 130. In one embodiment, the shift register circuit 130 may use a number of the shift registers, included within the shift register circuit 130, for delaying the data bits of the cmd_rd signal 138 based on the tRL signal 142 (e.g., 31, 63, 127, etc.). In alternative or additional embodiments, the shift register circuit 130 may include a pre-configured or fixed number of shift registers.

In any case, the shift register circuit 130 may operate according to the div_clk signal 140. Accordingly, each shift register of the shift register circuit 130 may delay the cmd_rd 138 data bits by one clock cycle using the div_clk signal 140. The shift register circuit 130 may use the div_clk signal 140 to clock in (input) the cmd_rd signal 138, shift the data bits of the cmd_rd signal 138 through the shift registers, and clock out (output) a cmd_rd_shifted signal 146.

The shift register circuit 130 may output the cmd_rd_shifted_pre signal 144 to the phase correction circuit 134, in-phase (aligned) or out of phase compared to the CLK signal 22 (the reference clock signal). Moreover, the shift register circuit 130 may provide a shift_start_finish signal 152 to the FIFO 132 that is indicative of start of clocking in the cmd_rd signal 138, start of clocking out the cmd_rd_shifted_pre signal 144, end of clocking in the cmd_rd signal 138, end of clocking out the cmd_rd_shifted_pre signal 144, or any combination thereof.

In the depicted embodiment, the command decoder 28 may also provide (or generate) a command phase (cmd_phase) signal 148. In alternative or additional embodiments, the cmd_phase signal 148 may be generated by different circuitry of the memory device 10 or memory device 100. In any case, the cmd_phase signal 148 may provide phase information indicative of relative position of the div_clk signal 140 and the CLK signal 22 when the cmd_rd signal 138 starts. As such, the phase correction circuit 134 may use the phase information to output the cmd_rd_shifted signal 146 based on the cmd_rd_shifted_pre signal 144 and the cmd_phase signal 148, as will be appreciated.

The cmd_phase signal 148 may include 1, 2, or other number of data bits to provide sufficient phase information based on relative clock frequency of the div_clk signal 140 with respect to the CLK signal 22 (or the reference clock signal). For example, when the div_clk signal 140 has a clock frequency that is half the clock frequency of the CLK signal 22, the cmd_phase signal 148 may include 1 data bit to provide an even or odd state (two states). Moreover, when the div_clk signal 140 has a clock frequency that is a quarter of the CLK signal 22 clock frequency, the cmd_phase signal 148 may include 2 data bits (four states).

Accordingly, the cmd_phase signal 148 may provide sufficient information regarding the alignment of the div_clk signal 140 and the CLK signal 22 when receiving the cmd_rd signal 138. Moreover, the phase correction circuit 134 may use the cmd_phase signal 148 to output the cmd_rd_shifted signal 146 in-line (or aligned, in-phase) with the CLK signal 22.

That said, the FIFO 132 may receive the cmd_phase signal 148, the cmd_rd signal 138, and the shift_start_finish signal 152. The FIFO 132 may store the cmd_phase signal 148 based on receiving an indication via the shift_start_finish signal 152 indicative of a start of clocking in the cmd_rd signal 138 by the shift register circuit 130. Moreover, the FIFO 132 may use the cmd_rd signal 138, as a clock signal, for clocking in (inputting) the cmd_phase signal 148. Accordingly, the FIFO 132 may store the cmd_phase signal 148 in coordination with the shift register circuit storing the cmd_rd signal 138.

Subsequently, the FIFO 132 may output the data bits of the cmd_phase signal 148 on a first-in first-out basis based on receiving an indication from the shift register circuit 130 via the shift_start_finish signal 152. For example, the shift register circuit 130 may provide an indication using the shift_start_finish signal 152 indicative of clocking out the cmd_rd_shifted_pre signal 144. The FIFO 132 may use the shift_start_finish signal 152 to clock out a cmd_phase_shifted signal 150.

The phase correction circuit 134 may receive the cmd_rd_shifted_pre signal 144 and the cmd_phase_shifted signal 150 along with the CLK signal 22. The phase correction circuit 134 may receive the cmd_rd_shifted_pre signal 144 using the div_clk signal 140 and output the cmd_rd_shifted signal 146 using the CLK signal 22. Moreover, the phase correction circuit 134 may further delay the cmd_rd_shifted_pre signal 144 based on the phase information provided by the cmd_phase_shifted signal 150.

That is, based on the cmd_phase_shifted signal 150, the phase correction circuit 134 may delay the cmd_rd_shifted_pre signal 144 to bring the output signal (the cmd_rd_shifted signal 146) in phase with the CLK signal 22 without losing information. In some embodiments, the phase correction circuit 134 may include a number of shift registers to delay the cmd_rd_shifted_pre signal 144 based on the CLK signal 22, as will be appreciated. Subsequently, the phase correction circuit 134 may output the cmd_rd_shifted signal 146 using the clock frequency of the internal clock signal of the memory device 10 and/or 100 (the CLK signal 22 or any other reference clock signal).

In a first example of the clock shifter circuit 56, the shift register circuit 130 may use a div2_clk signal with 31 shift registers positioned in the shift register circuit 130. The div2_clk signal may have a clock frequency that is half of the clock frequency of the CLK signal 22 (divided by 2). Moreover, the 31 shift registers may provide 31 delay clock cycles using the div2_clk signal. That is, duration of each delay clock cycle of the 31 delay clock cycles may be longer and correspond to 2 clock cycle delays of the CLK signal 22. Accordingly, the 31 shift registers may delay the cmd_rd signal 138 by 62 clock cycles based on the CLK signal 22.

In some cases, by clocking in the cmd_rd signal 138 using the div2_clk signal, the shift register circuit 130 may clock in the cmd_rd signal 138 out of phase with respect to the CLK signal 22. Accordingly, the phase correction circuit 134 may provide one or more additional delay clock cycles using the CLK signal 22 to bring the output signal in-phase. In some embodiments, the phase correction circuit 134 may include one or more shift registers to provide the one or more additional delay clock cycles. In any case, the clock shifter circuit 56 may delay the cmd_rd signal 138 using the div4_clk signal with the 31 shift registers positioned in the shift register circuit 130 and the CLK signal 22 with one or more shift registers positioned in the phase correction circuit 134. Accordingly, the clock shifter circuit 56 may delay the cmd_rd signal 138 by 64 clock cycles based on the CLK signal 22 (tRL=64).

In a second example, the shift register circuit 130 may use the div2_clk signal with 63 shift registers positioned in the shift register circuit 130. The 63 shift registers may provide 63 delay clock cycles using the div2_clk signal. The duration of each delay clock cycle of the 63 delay clock cycles corresponds to 2 clock cycle delays of the CLK signal 22. That is, the shift register circuit 130 may provide 126 delay clock cycles using the CLK signal 22.

Similar to the first example, by clocking in the cmd_rd signal 138 using the div2_clk signal, the shift register circuit 130 may clock in the cmd_rd signal 138 out of phase with respect to the CLK signal 22. Accordingly, the phase correction circuit 134 may provide one or more additional delay clock cycles using the CLK signal 22 to bring the output signal in-phase. In any case, the clock shifter circuit 56 may delay the cmd_rd signal 138 using the div2_clk signal with the 63 shift registers positioned in the shift register circuit 130 and the CLK signal 22 with one or more shift registers positioned in the phase correction circuit 134. Accordingly, the clock shifter circuit 56 may delay the cmd_rd signal 138 by 128 clock cycles based on the CLK signal 22 (tRL=128).

In a third example, the shift register circuit 130 may use a div4_clk signal with 31 shift registers positioned in the shift register circuit 130. The div4_clk signal may have a clock frequency that is a quarter of the clock frequency of the CLK signal 22 (divided by 4). Moreover, the 31 shift registers may provide 31 delay clock cycles using the div4_clk signal. That is, duration of each delay clock cycle of the 31 delay clock cycles may be longer and correspond to 4 clock cycle delays of the CLK signal 22. Accordingly, the 31 shift registers may delay the cmd_rd signal 138 by 124 clock cycles based on the CLK signal 22.

Based on clocking in the cmd_rd signal 138 using the div4_clk signal, the shift register circuit 130 may clock in the cmd_rd signal 138 out of phase with respect to the CLK signal 22. Accordingly, the phase correction circuit 134 may provide one or more additional delay clock cycles using the CLK signal 22 to bring the output signal in-phase. In some embodiments, the phase correction circuit 134 may include a number of shift registers to provide the one or more additional delay clock cycles. That is, the clock shifter circuit 56 may delay the cmd_rd signal 138 using the div4_clk signal with the 31 shift registers positioned in the shift register circuit 130 and the CLK signal 22 with one or more shift registers positioned in the phase correction circuit 134. Accordingly, the clock shifter circuit 56 may delay the cmd_rd signal 138 by 128 clock cycles based on the CLK signal 22 (tRL=128).

Figure 4:
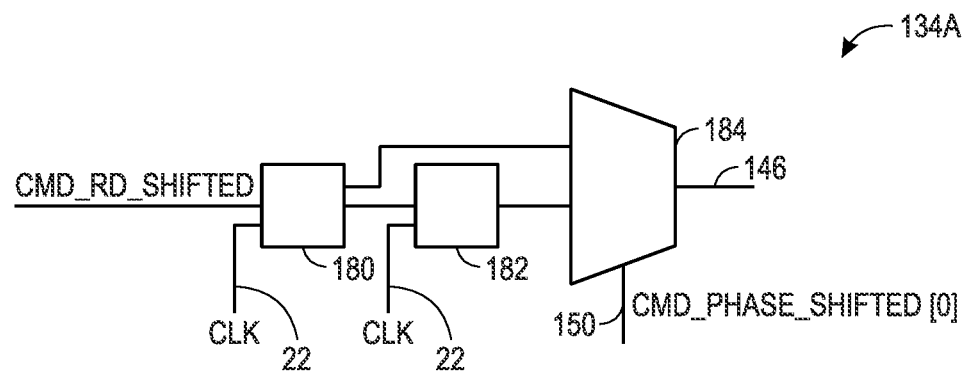
FIG. 4 is a phase correction circuit of the clock shifter circuit of FIG. 3 when using a clock frequency that is half of a reference clock frequency of a memory device, in accordance with an embodiment.
Figure 5:
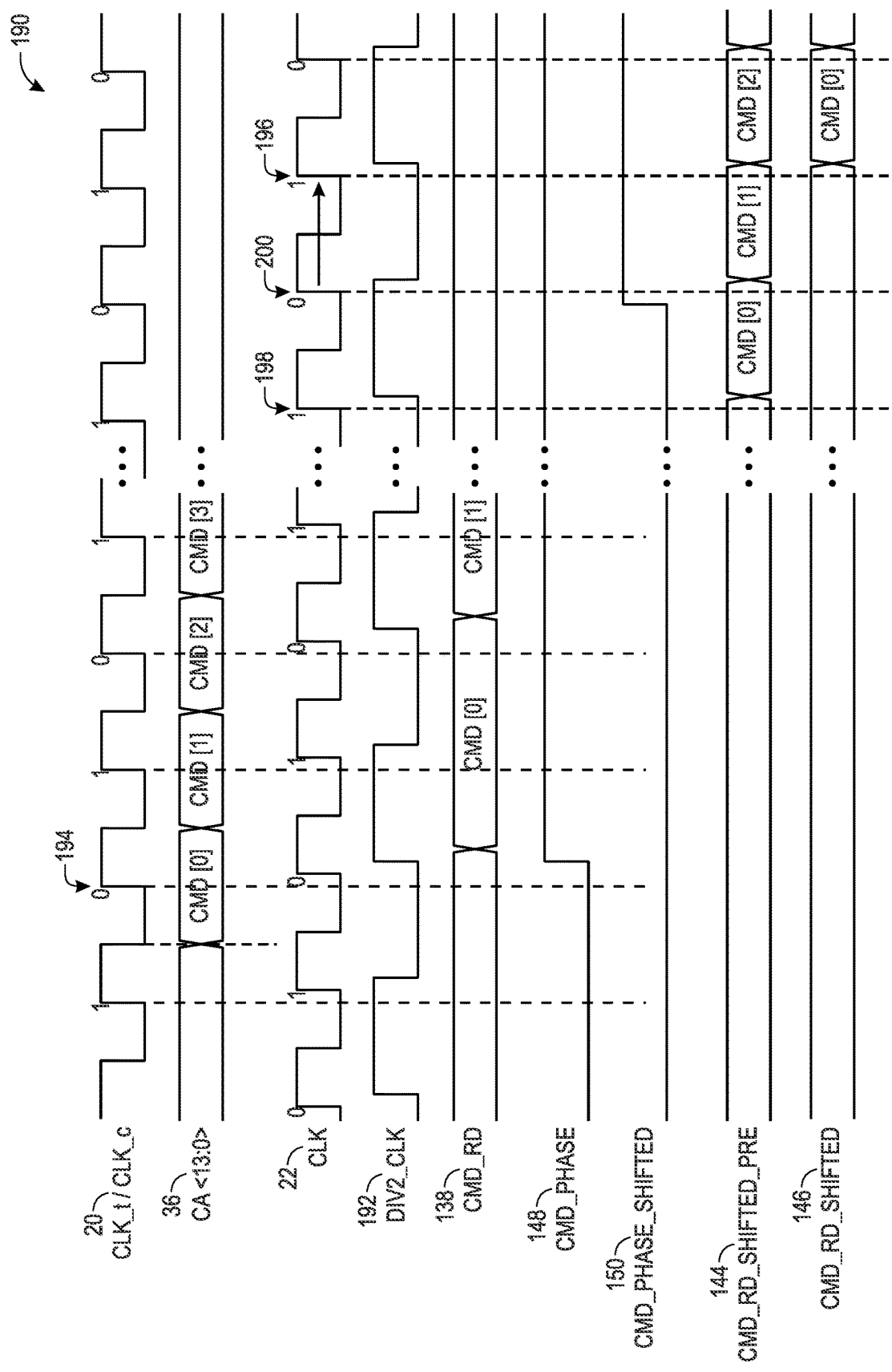
FIG. 5 is a data time graph of signals when using a clock frequency that is half of a reference clock frequency of a memory device with the clock shifter circuit of FIG. 3, in accordance with an embodiment.
Figure 6:
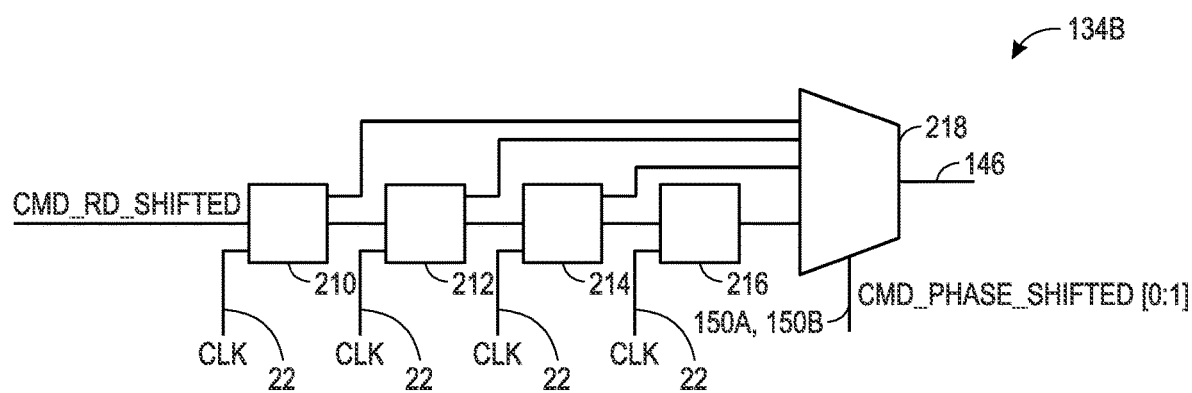
FIG. 6 is a phase correction circuit of the clock shifter circuit of FIG. 3 when using a clock frequency that is a quarter of a reference clock frequency of a memory device, in accordance with an embodiment.
Figure 7:
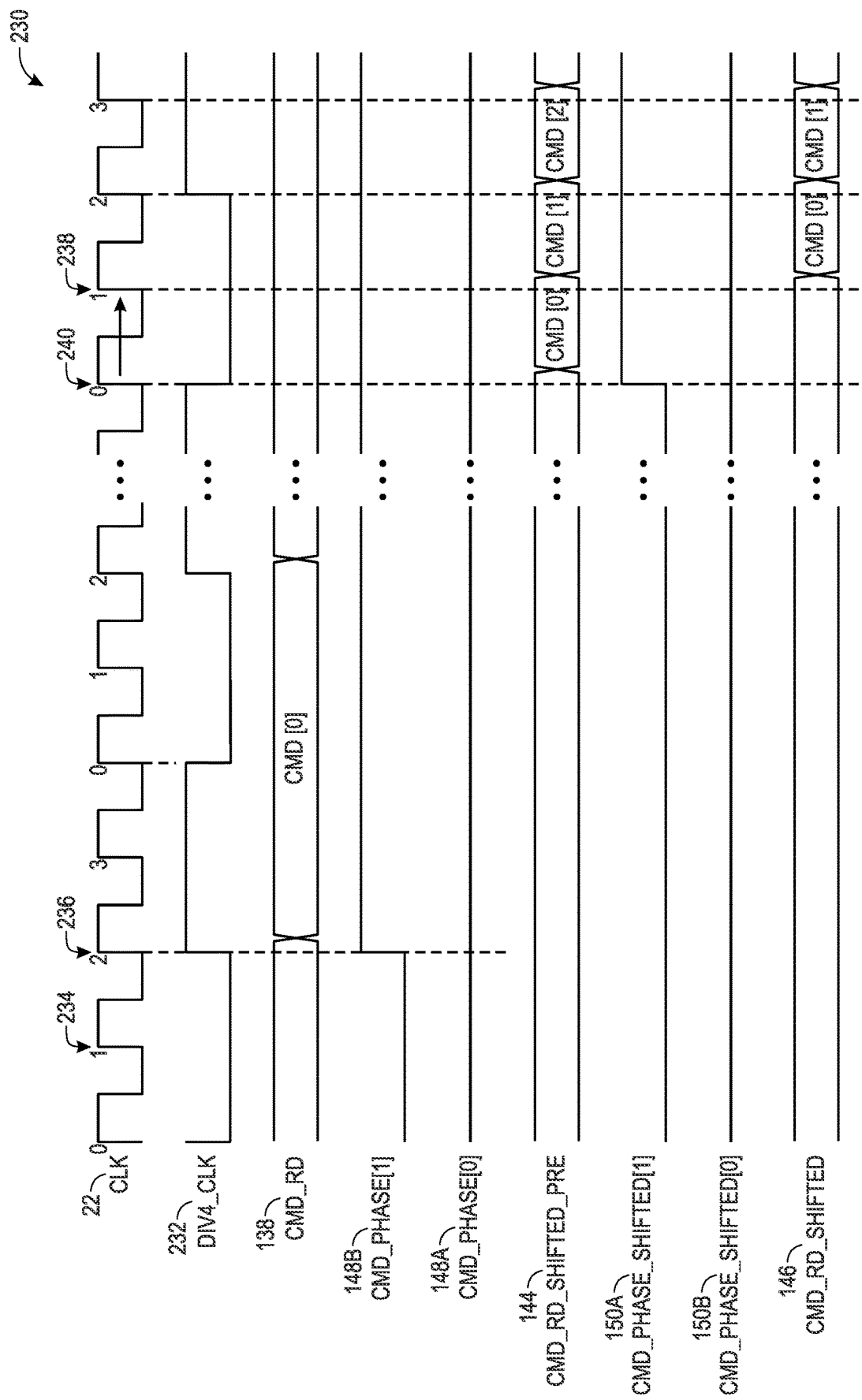
FIG. 7 is a data time graph of signals when using a clock frequency that is a quarter of a reference clock frequency of a memory device with the clock shifter circuit of FIG. 3, in accordance with an embodiment.

With the foregoing in mind, FIGS. 4 and 6 depict different embodiments of the phase correction circuit 134. Specifically, FIG. 4 depicts a phase correction circuit 134A associated with using the div2_clk signal with the shift register circuit 130 to provide the cmd_rd_shifted_pre signal 144 and the cmd_phase_shifted signal 150. Moreover, FIG. 6 depicts a phase correction circuit 134B associated with using the div4_clk signal with the shift register circuit 130 to provide the cmd_rd_shifted_pre signal 144 and the cmd_phase_shifted signal 150. FIG. 5 is a data time graph depicting example signals associated with using the div2_clk signal with the clock shifter circuit 56. Moreover, FIG. 7 is a data graph depicting example signals associated with using the div4_clk signal with the clock shifter circuit 56.

Referring now to FIG. 4, the phase correction circuit 134A may include two shift registers 180 and 182 and a multiplexer (MUX) 184. The shift registers 180 and 182 may operate based on using the div2_clk signal. As mentioned above, the div2_clk signal may have a clock frequency that is half of the clock frequency of the internal clock signal (CLK) 22 (divided by 2). Based on using the div2_clk signal, the cmd_phase_shifted signal 150 (and also the cmd_phase signal 148 input to the FIFO 132 shown in FIG. 3) may be either high (logic 1 or even phased) or low (logic 0 or odd phased).

The cmd_phase_shifted signal 150 may become high (even phased) or low (odd phased) based on when the memory device 10 or 100 receives a first data bit of the command/address signals 36 (CA<13:0>) (e.g., a command [0], a first portion of the input data, etc.). The cmd_phase_shifted signal 150 may become high (or even phased) when a rising (e.g., or falling) edge of the internal clock signal (CLK) 22 aligns with a rising edge of the div2_clk signal subsequent or during receiving the first data bit of the command/address signals 36 (CA<13:0>) by the memory device 10 or 100. Alternatively, the cmd_phase may become low (or odd phased) when a rising edge of the internal clock signal (CLK) 22 aligns with a falling edge of the div2_clk signal subsequent or during receiving the first data bit of the command/address signals 36 (CA<13:0>).

It should be appreciated that the alignment of the rising edge of the CLK signal 22 and the rising/falling edge of the div2_clk signal, described above and detailed in examples below, is relative and not absolute. Moreover, it should be appreciated that, in different embodiment, any other reference clock signal such as the external clock signal 20 may be used instead of the CLK signal 22.

With the foregoing in mind, when using the div2_clk signal, the odd phased cmd_rd_shifted_pre signal 144 is latched one CLK signal 22 clock cycle later than the even phased cmd_rd_shifted_pre signal 144. As mentioned above, the shift register circuit 130 may use the rising edge of the div2_clk signal to latch the cmd_rd signal 138. Accordingly, the odd phase of the cmd_rd_shifted_pre signal 144 may indicate that the cmd_rd signal 138 is latched by the shift register circuit 130 out of phase by one clock cycle based on the CLK signal 22. The odd phased cmd_rd_shifted_pre signal 144 is latched later than the even phased cmd_rd_shifted_pre signal 144.

Accordingly, the phase correction circuit 134A may delay the odd phased and even phased cmd_rd_shifted_pre signal 144 differently to align the output signal with the CLK signal 22. For example, the phase correction circuit 134A may delay the odd phased cmd_rd_shifted_pre signal 144 by one clock cycle and the even phased cmd_rd_shifted_pre signal 144 by two clock cycles using the CLK signal 22. Accordingly, the shift register circuit 130 may output the cmd_rd_shifted signal 146 with specific number of delay clock cycles, using the CLK signal 22, regardless of whether the first data bit of the command/address signals 36 (CA<13:0>) is received at a rising or falling edge of the div2_clk signal.

FIG. 5 depicts an example data graph 190 depicting the signals described above when using a div2_clk signal 140A with the phase correction circuit 134A. At time 194, the memory device 10 or 100 may receive the command [0] of the command/address signals 36 (CA<13:0>). In the depicted embodiment, the CLK 20 may be the reference clock signal for the clock shifter circuit 56. At the time 194, a rising edge of the CLK signal 22 aligns with a rising edge of the div2_clk signal 140A. Accordingly, the cmd_phase signal 148 may become high or even phased to indicate a reference time of latching the input commands (the command/address signals 36 (CA<13:0>)).

Based on the high cmd_phase signal 148, as described above, the phase correction circuit 134A may delay the output signal (the cmd_rd_shifted signal 146), by 2 clock cycles using the CLK signal 22. That is, based on the high cmd_phase_shifted signal 150, the clock shifter circuit 56 may output the cmd_rd_shifted signal 146 at time 196, instead of time 198, after 2 delay clock cycles based on the CLK signal 22. As mentioned above, the clock shifter circuit 56 may use the shift register 182 of the phase correction circuit 134A to cause the additional delay. That said, in different embodiments, the phase correction circuit 134A may delay the cmd_rd_shifted signal 146 by different number of clock cycles to align the output signal with a reference clock signal.

It should be appreciated based on the description above and depicted circuitry in FIGS. 3 and 4, the clock shifter circuit 56 may also output the cmd_rd_shifted signal 146 at the time 196 when the cmd_phase_shifted signal 150 is low (or odd phased). However, when the cmd_phase_shifted signal 150 is low (odd phased), the clock shifter circuit 56 may bypass the shift register 182 since the cmd_rd_shifted signal 146 is already delayed by 1 clock cycle based on the CLK signal 22. That is, the based on the low cmd_phase_shifted signal 150, the clock shifter circuit 56 may output the cmd_rd_shifted signal 146 at time 196, instead of time 200, after 1 delay clock cycle based on the CLK signal 22.

Moreover, when using 31 shift registers with the div2_clk signal 140A, the time 196 may be 64 clock cycles after the time 194 regardless of the cmd_phase signal 148 being even or odd. In another example, when using 63 shift registers with the div2_clk 140A, the time 196 may be 128 clock cycles after the time 194 regardless of the cmd_phase signal 148 being even or odd. Furthermore, it should be appreciated that the time alignment of the depicted signals is by the way of example and merely for illustration purposes. That is, in different embodiments, the depicted signals may align in a different manner to achieve the same result.

Referring now to FIG. 6, the phase correction circuit 134B may include a multiplexer (MUX) 218 and four shift registers 210, 212, 214, and 216. The shift registers 210, 212, 214, and 216 may operate based on using the div4_clk signal. As mentioned above, the div4_clk signal may have a clock frequency that is a quarter of the clock frequency of a reference clock frequency (e.g., the CLK signal 22). Based on using the div4_clk signal, the cmd_phase_shifted signal 150 (and also the cmd_phase signal 148 of FIG. 3) may include a cmd_phase_shifted signal 150A and a cmd_phase_shifted signal 150B. The cmd_phase_shifted signal 150A and the cmd_phase_shifted signal 150B may each provide one data bit to indicate four possible phase states of the cmd_rd_shifted_pre signal 144 to the MUX 218.

The cmd_phase_shifted signals 150A and 150B may indicate one of the four possible states (e.g., 0, 1, 2, and 3) based on when the memory device 10 or 100 receives a first data bit of the command/address signals 36 (CA<13:0>) (e.g., a command [0]). That is, the cmd_phase signal 148 may indicate one of the four possible phase states. Each of the phase states may indicate when a rising edge of a reference clock signal (e.g., the CLK signal 22) aligns with a rising edge of the div4_clk signal, subsequent or during receiving the first data bit of the command/address signals 36 (CA<13:0>) by the memory device 10 or 100. As mentioned above, the alignment of the rising edge of the CLK signal 22 and the rising/falling edge of the div4_clk signal, described above and detailed below, is relative and not absolute.

With the foregoing in mind, when using the div4_clk signal, each of the four phase states may indicate a difference in the time receiving the first data bit of the command/address signals 36 (CA<13:0>) based on the CLK signal 22. The shift register circuit 130 may use the rising edge of the div4_clk signal to latch the cmd_rd signal 138. Accordingly, the phase of the cmd_rd_shifted_pre signal 144 may indicate whether the command/address signals 36 (CA<13:0>) is latched 0, 1, 2, or 3 clock cycles, based on the CLK signal 22, after the command/address signals 36 (CA<13:0>) is originally received.

Accordingly, based on a phase state provided by the cmd_phase_shifted signals 150A and 150B, the MUX 218 may receive the cmd_rd_shifted_pre signal 144 from the shift registers 210, 212, 214, or 216, respectively. That is, the MUX 218 may receive the cmd_rd_shifted_pre signal 144 after 1, 2, 3, or 4 delay clock cycles provided by the shift registers 210, 212, 214, or 216, based on the phase information. As such, the clock shifter circuit 56 using the phase correction circuit 134B may output the cmd_rd_shifted signal 146 after a set number of delay clock cycles.

FIG. 7 depicts an example data graph 230 depicting the signals described above when using a div4_clk signal 140B with the phase correction circuit 134B. In the depicted data graph 230, the clock shifter circuit 56 may receive the command [0] of the command/address signals 36 (CA<13:0>) (not shown) at time 234. At time 236, the rising edge of the CLK signal 22 aligns with a rising edge of the div4_clk signal 140B. Accordingly, a first data bit of the cmd_phase signal 148A may stay low (e.g., logic 0) and a second data bit of the cmd_phase signal 148B may become high (e.g., logic 1).

The cmd_phase signals 148A and 148B may indicate one clock cycle delay between receiving the input (the command/address signals 36 (CA<13:0>)) at the time 234 and clocking in (or latching) the input at the time 236. As such, the clock shifter circuit 56 may output the cmd_rd_shifted signal 146 with one clock cycle delay, based on the CLK signal 22, at time 238 instead of time 240.

It should be appreciated based on the description above and depicted circuitry in FIGS. 3 and 6, the clock shifter circuit 56 may also output the cmd_rd_shifted signal 146 at the time 238 when the cmd_phase_shifted signal 150 indicates other values (e.g., 0, 2, or 3). Based on a value of the cmd_phase_shifted signals 150A and 150B, the clock shifter circuit 56 may bypass the shift registers 212, 214, and/or 216.

Moreover, when using 31 shift registers with the div4_clk signal 140B, the time 238 may be 128 clock cycles after the time 234 regardless of the cmd_phase signal 148 indicating 0, 1, 2, or 3. In another example, when using 63 shift registers with the div4_clk 140B, the time 238 may be 256 clock cycles after the time 234 regardless of a value of the cmd_phase signal 148. Furthermore, it should be appreciated that the time alignment of the depicted signals is by the way of example and merely for illustration purposes. That is, in different embodiments, the depicted signals may align in a different manner to achieve the same result.

While the embodiments set forth in the present disclosure may be susceptible to various modifications and alternative forms, specific embodiments have been shown by way of example in the drawings and have been described in detail herein. However, it may be understood that the disclosure is not intended to be limited to the particular forms disclosed. The disclosure is to cover all modifications, equivalents, and alternatives falling within the spirit and scope of the disclosure as defined by the following appended claims.

What is claimed is:

1. A memory device comprising:
a plurality of memory cells configured to be accessed by access commands according to a first clock frequency of a first clock signal and based on a data access time; and
clock shifter circuitry configured to delay the access commands based on the data access time, wherein the clock shifter circuitry comprises:
shift register circuitry comprising a plurality of shift registers configured to:
receive the access commands based on a second clock signal having a second clock frequency, wherein the second clock frequency is a fraction of the first clock frequency;
delay the access commands using one or more shift registers of the plurality of shift registers based on the second clock frequency; and
output the access commands using the second clock signal; and
phase correction circuitry configured to:
receive the access commands from the shift register circuitry using the second clock frequency;
delay the access commands based on phase information of the access commands and the first clock frequency to output the access commands based on the data access time; and
output the access commands using the first clock frequency.

2. The memory device of claim 1, wherein the phase information is indicative of relative position of an edge of the second clock signal and an edge of the first clock signal when the memory device receives a first data bit of the access commands.

3. The memory device of claim 1, wherein the shift register circuitry comprises first-in first-out (FIFO) circuitry configured to receive the phase information of the access commands and provide the phase information to the phase correction circuitry.

4. The memory device of claim 3, wherein the FIFO circuitry is configured to provide the phase information to the phase correction circuitry in response to receiving a signal from the shift register circuitry.

5. The memory device of claim 3, wherein the phase correction circuitry comprises a number of shift registers configured to further delay the access commands based on using the first clock frequency.

6. The memory device of claim 5, wherein the phase correction circuitry is configured to further delay the access commands by a number of clock cycles of the first clock signal, wherein the number of clock cycles is based on bypassing a number of the shift registers using the phase information.

7. The memory device of claim 1, wherein a cumulative time of delaying the access commands by the shift register circuitry and the phase correction circuitry is based on the data access time.

* * * * *